United States Patent [19]

Sakurada et al.

[11] 4,163,935

[45] Aug. 7, 1979

[54] APPARATUS FOR CHECKING A BATTERY VOLTAGE

[75] Inventors: Nobuaki Sakurada, Yokohama; Yukio Mashimo, Tokyo; Tadashi Ito; Fumio Ito, both of Yokohama; Nobuhiko Shinoda, Tokyo, all of Japan

[73] Assignee: Canon Kabushiki Kaisha, Japan

[21] Appl. No.: 878,774

[22] Filed: Feb. 17, 1978

Related U.S. Application Data

[63] Continuation of Ser. No. 741,935, Nov. 15, 1976, abandoned, which is a continuation of Ser. No. 555,823, Mar. 6, 1975, abandoned.

[51] Int. Cl.$^2$ ............................................. G01N 27/42
[52] U.S. Cl. .................................. 324/29.5; 324/133; 340/706
[58] Field of Search ............ 340/248 A, 248 B, 248 C, 340/249, 336; 354/23 D, 29, 53, 60 EL; 324/96, 122, 131, 133, 72.5, 149, 29.5

[56] References Cited

U.S. PATENT DOCUMENTS

| 3,534,354 | 10/1970 | Galginaitis | 324/133 |
| 3,755,806 | 8/1973 | Bunting | 340/324 R |

Primary Examiner—M. Tokar
Attorney, Agent, or Firm—McGlew and Tuttle

[57] ABSTRACT

An apparatus for checking the voltage of a power source battery in a photographic camera is disclosed. In simple form, this apparatus comprises first and second series circuits connected in parallel with each other to the battery, the first one of which has a luminous diode and a resistor, and the second one of which has two luminous diodes and a resistor, the characteristics of the luminous diodes and resistors being so selected that, when the actual voltage is dropped from a predetermined level, a difference between the brightnesses of the luminous diodes of the first and second circuits results to apprise the camera operator of the drop in battery voltage.

7 Claims, 9 Drawing Figures

APPARATUS FOR CHECKING A BATTERY VOLTAGE

CROSS-REFERENCE TO RELATED APPLICATIONS

This application is a continuation of a previous application with Ser. No. 741,935 filed Nov. 15th, 1976, which is now abandoned and itself was a continuation of Ser. No. 555,823 filed Mar. 6th, 1975, which also is now abandoned, both applications having had the title "AN APPARATUS FOR CHECKING A BATTERY VOLTAGE."

BACKGROUND OF THE INVENTION

1. Field of the Invention

This invention relates to an apparatus for checking battery voltage, and more particularly to an apparatus for checking the actual voltage of a battery in a photographic camera by use of a plurality of luminous diodes.

2. Description of the Prior Art

To check the actual voltage of a battery as a power source in a camera, the commonly used indicator is an electric meter connected across the battery. The sensitivity of the meter, however, is very susceptible to vibration or shock. In order to avoid such trouble, a luminous diode indicator has been developed, as disclosed in U.S. Pat. No. 3,452,347, in which the battery voltage is checked on the basis of an evaluation of the brightness of this luminous diode. By this brightness evaluation, however, it is impossible for the camera operator to determine with reliability whether the voltage of the battery is higher than a predetermined value, although he can be apprised of a change in the battery voltage.

SUMMARY OF THE INVENTION

An object of the present invention is to provide an apparatus for checking the battery voltage which is capable of indicating, with reliability, whether the battery voltage is higher than a predetermined level.

Another object of the invention is to provide an apparatus for checking the battery voltage which provides an indication that is insensitive to vibration or shock introduced thereto.

Still another object of the invention is to provide a battery voltage checking apparatus which indicates the checked battery voltage by means of display elements arranged to constitute part of a display device provided in an electrical circuit which is supplied with electrical energy from the battery to be checked.

Other objects and features of the invention will become apparent from the following detailed description taken in conjunction with the accompanying drawings.

DESCRIPTION OF THE PREFERRED EMBODIMENTS

Figure 1:
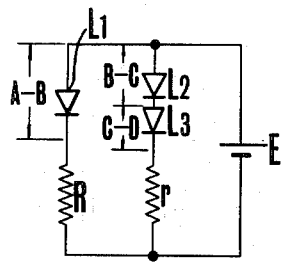
FIG. 1 is a schematic diagram of a first embodiment of an apparatus for checking the battery voltage according to the invention.

Referring to FIG. 1, there is shown a first embodiment of an apparatus for checking the battery voltage as comprising first and second series circuits connected in parallel with each other to a battery E to be checked. The first circuit comprises a luminous diode L1 as a semi-conductor light emitting element and a fixed resistor R having a current control function, and the second circuit comprises two luminous diodes L2 and L3 series-connected with each other and a fixed resistor, r. The luminous diodes L1, L2 and L3 are almost identical to one another in response characteristics. The resistors R and r have resistance values which are identical to each other, and selected so as to define the voltage at which the brightness of the luminous diode L1 begins to decrease.

Figure 2A:
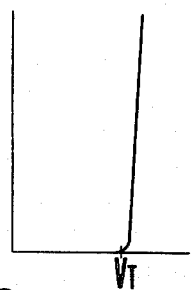
FIGS. 2(a) and 2(b) are graphs showing the response characteristics of a luminous diode useable in the circuit of FIG. 1.
Figure 2B:
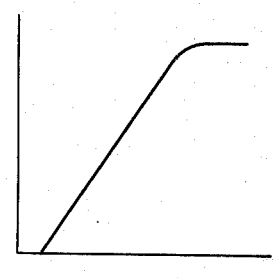
Figure 2C:
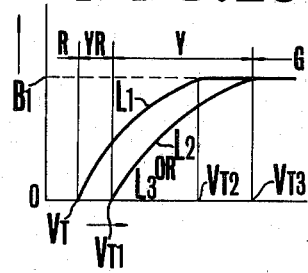
FIG. 2(c) is a graph showing certain operating principles of the embodiment of FIG. 1.

The operation of the apparatus of FIG. 1 will next be explained with reference to FIGS. 2(a), 2(b) and 2(c). When the voltage of battery E is so low that the voltage A-B across luminous diode L1 is lower than the threashold voltage $V_T$ of diode L1 as shown in FIG. 2(a), where the current versus voltage characteristic curve indicates that when the voltage across the luminous diode is lower than the threshold value $V_T$, the luminous diode is not illuminated, a voltage lower than the threshold voltage $V_T$ is applied to each of the luminous diodes L2 and L3 in the second series circuit. Therefore, none of the diodes L1, L2 and L3 are illuminated. When the battery voltage E is in a range, designated by YR in FIG. 2(c), between the threshold voltage $V_T$ and two times this voltage, that is $2V_T$, the brightness of luminous diode L1 increases with increase in current flowing therethrough as shown in FIG. 2(b), wherein the brightness versus current characteristic curve indicates that the brightness of the luminous diode is directly proportional to the current intensity and is illustrated as having a shoulder at a current corresponding to a voltage higher than two times the threshold voltage, namely $2V_T$, but diodes L2 and L3 of the second series circuit still remain unilluminated because each of the voltages B-C and C-D across diodes L2 and L3 respectively is lower than the threshold voltage $V_T$. As the battery voltage E is further increased so as to fall in the range of voltages higher than two times the threshold voltage $2V_T=V_{T1}$, and designated by Y in FIG. 2(c), the brightness of diode L1 is increased to a level corresponding to the voltage $V_{T2}$, while diodes L2 and L3 begin to illuminate at a voltage $V_{T1}$, and the brightness of each of the diodes L2 and L3 is increased to a level corresponding to a voltage $V_{T3}$ higher than $V_{T2}$. In a range of battery voltages higher than $V_{T3}$, the brightness of the three luminous diodes L1, L2 and L3 in the first and second series circuits are equalized with each other, whereby it is impossible for the operator to detect any change in the battery voltage E. It will be appreciated from the foregoing description that, when the design parameters of the first and second series circuit are properly selected to set the dynamic range of the apparatus as defined by the range Y in FIG. 2(c), the resultant apparatus enables the operator to determine, with high reliability whether the battery voltage E is above or below the lower limit of a range in which the battery voltage has to be maintained by evaluating the brightnesses of luminous diodes L1, L2 and L3 in the first and second series circuits in comparison with each other.

Figure 3A:
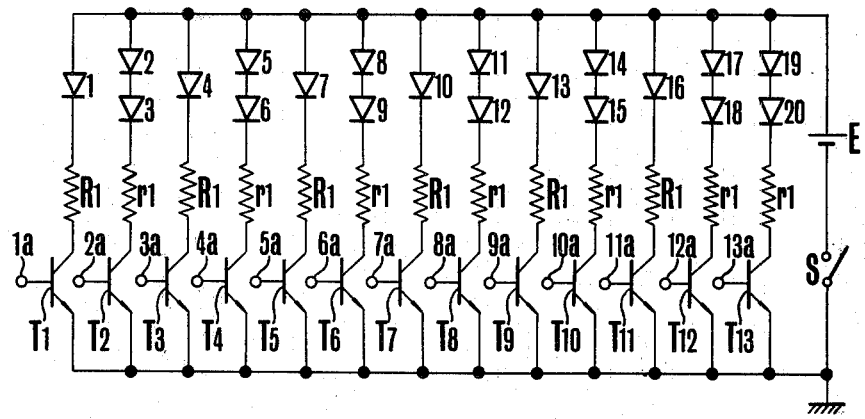
FIG. 3(a) is a circuit diagram of a second embodiment of the invention.
Figure 3B:
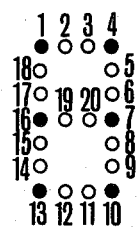
FIG. 3(b) is a top view showing an arrangement of the display elements of the second embodiment of the invention.

In FIGS. 3(a) and 3(b), there is shown a second embodiment of a battery voltage checking apparatus of the invention as incorporated in a display system of a photographic camera. The display system includes thirteen transistors T1 through T13 having collector electrodes successively connected to six branch circuits having an element arrangement similar to that of the first series circuit of FIG. 1 and to seven branch circuits having an element arrangement similar to that of the second series circuits, having emitter electrodes grounded and connected through a main switch S to the negative terminal of a battery E to be checked, and having base electrodes 1a through 13a to which respective drive signals are applied so that the transistors T1 through T13 are selectively rendered conducting to display a certain character, figure, or symbol by means of twenty luminous diodes 1 through 20. For this purpose, the light emitting portion of each of the luminous diodes is configured in the form of a dot segment display element, and these twenty dot segments are arranged in a manner to form a readout device of the type described as shown in FIG. 3(b). The resistors R1 and r1 have current control functions identical to those of resistors R and r of FIG. 1 respectively. When the battery voltage is higher than a predetermined value, all of the branch circuits are rendered conductive for saturation current of each of the luminous diodes to permit the readout device to perform a display in response to an application of drive signals to selected base electrodes of transistors T1 through T13. For example, when a combination of selected base electrodes is such that transistors other than T8, T9, T18 and T19 are rendered conducting, the readout device of FIG. 3(b) displays a figure "2." When the battery voltage E drops from the predetermined value, the brightness of each of the luminous diodes the other than diodes 1, 4, 7, 10, 13 and 16 shown by the solid circles is decreased to display a six dot symbol indicated by the solid circles, so that the operator is aware if the voltage of a battery E to be checked has dropped below the lower limit of a range in which the battery voltage E has to be maintained for satisfactory operation of the camera. It is to be noted that this readout device is preferably arranged in the viewfinder of the camera, so that the checking result can be seen by a camera operator looking through the viewfinder.

Figure 4A:
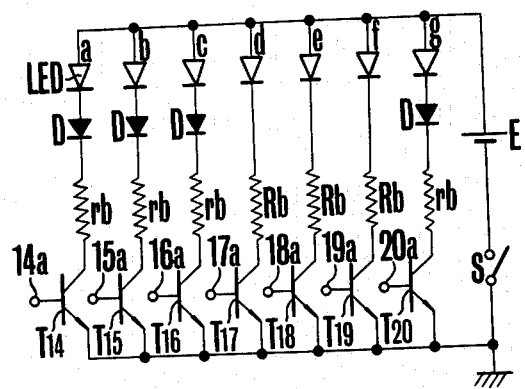
FIG. 4(a) is a circuit diagram of a third embodiment of the invention.
Figure 4B:
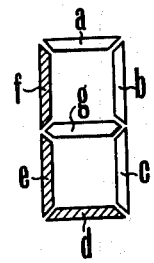
FIG. 4(b) is a top view showing an arrangement of the display elements of the third embodiment of the invention.

In FIG. 4, a third embodiment of the invention adapted for performance similar to that of the embodiment of FIG. 3 comprises seven luminous diodes a through g having light-emitting portions of configured in the form of shown in FIG. 4(b), four non-luminous diodes D series-connected to respective luminous diodes a, b, c and g, and seven transistors T14 through T20 having collector electrodes successively connected to the luminous diodes a through g through the diodes D and through seven respective resistors Rb and rb having current control functions, having emitter electrodes grounded and connected through a main switch S to the negative terminal of a battery E to be checked, and having base electrodes 14a through 20a to which drive signals are selectively applied to permit the readout device of FIG. 4(b) to perform the corresponding display.

Various modifications may be made in the arrangement, construction and combination of the essential elements of the apparatus of FIGS. 1, 3 and 4. For example, each of the series-connected combinations of luminous diodes L2 and L3, 2 and 3 or a and D, for example, may be replaced by a single light emitting element having a threshold voltage equivalent to the sum of the threshold voltages of the luminous diodes L2 and L3, 2 and 3 or a and D respectively.

Figure 5:
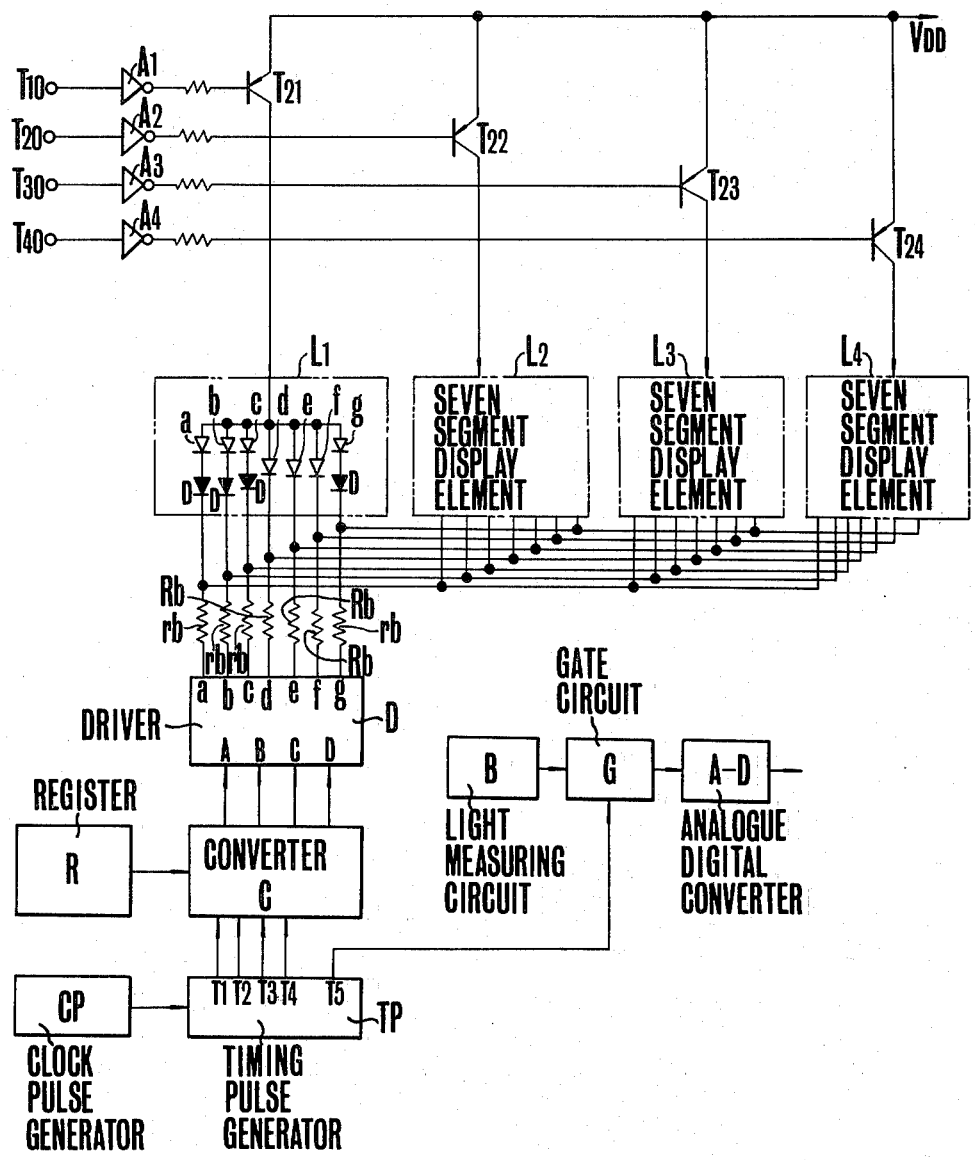
FIG. 5 is a schematic view, partially in block form, of an exposure value display system of digital type for a camera in which four apparatuses of FIG. 4 are incorporated to constitute part of the readout device thereof.

FIG. 5 shows a fourth embodiment of a battery checker apparatus of the invention as incorporated in each digit readout member of an exposure value display system for a camera associated with a digital exposure control system. The digital exposure control system is illustrated as including a light measuring circuit B for providing a voltage proportional to the object brightness level, of which the output is connected through a gate circuit G to an analog-to-digital converter (hereinafter abbreviated as A-D converter). This A-D converter has the function of converting the analog signal from the light measuring circuit to a digital signal which serves as an object brightness information for a digital computer not shown. Responsive to additional photographic informations such as film speed and either of preselected shutter speed and diaphragm value, the computer derives an output signal representing an exposure value, i.e., effective aperture value (hereinafter abbreviated as Av), or effective exposure interval (hereinafter abbreviated as Tv), and which is directed to a register R of the exposure value display system.

The display system includes a clock pulse generator CP for generating a train of evenly spaced pulses at a predetermined frequency, a timing pulse generator TP to produce five pulse trains T1 through T5, one of which, in this instance, the pulse train T5, is applied to the gate circuit G and the other of which pulse trains T1 through T4 are applied to a converter C, the pulses in the pulse trains T1 through T4 being time-displaced with respect to each other and to the pulses in the pulse train T5. The converter C has an input terminal connected to the output of register R to convert the signal representing, for example, $Tv=5$, to a number of digits corresponding to a shutter speed, for example, 1/125 second. The output of converter C is decoded by a seven segment decoder driver D connected to each of the four digit readout members of the seven segment type, L1 through L4, similar in construction to the apparatus of FIG. 4, so that, responsive to the signals appearing at the output terminals a through g of driver D, the seven luminous diodes a through g are selectively illuminated, or unilluminated. The exposure value display system further includes four inverters A1 through A4 having input terminals T10, T20, T30 and T40 connected to the output terminals T1 through of the timing pulse generator TD respectively, and having output terminals connected to respective base electrodes of transistors T21, T22, T23 and T24. The transistors have collector electrodes each connected to a potential $V_{DD}$, and emitter electrodes connected to respective digit display members L1 through L4.

The operation of the system of FIG. 5 is as follows. It is assumed that the register R stores a shutter speed information Tv in the form of a number of four digits. At first, the first digit is converted by converter C in synchronism with a timing pulse of the pulse train T1 and then decoded by driver D. At the same time, transistor T21 is rendered conducting by occurrence of the timing pulse so that the readout member L1 displays the first digit of the shutter speed information number Tv. Next, the second digit of the number is displayed by the readout member L2 in synchronism with a timing pulse T2 during which the transistor T21 is non-conducting because no timing pulse arrives on the base electrode thereof and, therefore, the readout member L1 is unilluminated. Such procedure repeats itself to successively display the third and fourth digits by readout members L3 and L4 respectively. As the timing pulses T1 through T4 occur at a very high frequency, the operator perceives the successively displayed four digits as a single four digits number. When the potential $V_{DD}$ is dropped below a predetermined level, the luminous diodes a, b, c and g can not be illuminated by the timing pulses which would otherwise cause energization of these luminous diodes, as has been already mentioned in connection with the third embodiment of FIG. 4.

It will be seen from the foregoing description that the present invention provides a battery checker particularly adapted for use in a photographic camera, and the components of the battery checker may be constituted by a part of the components of the display system of the camera, whereby the bulk, weight and complexity of the battery checker and display system combination are not unduly increased. Therefore, it may be aptly pointed out that the features and advantages of the invention are of very great importance in designing a compact camera which is required to incorporate a battery cheker mechanism therein.

What is claimed is:

1. An apparatus for checking the driving voltage of a battery in a digital display device comprising:
    (a) a digital display device including in addition to the battery whose output voltage is to be checked: (1) a first means for producing a control signal corresponding to a normal pattern to be displayed; (2) a plurality of series circuits connected in parallel with one another to said battery, each circuit having at least one light emitting diode which forms at least one part of said normal pattern and also having a driving means which controls illumination of the light emitting diode in response to the control signal from said first means; and
    (b) diode means connected in series between at least one of said light emitting diodes and said driving means for controlling the illumination of the light emitting diode provided in said circuit so as to assure that the output of said battery, when its terminal voltage is below a predetermined value, makes the pattern into a special symbol different from the normal pattern provided in accordance with the control signal.

2. An apparatus for checking the driving voltage of a battery in a digital display device comprising:
    (a) a digital display device including in addition to the battery whose output voltage is to be checked: (1) a first means for producing a control signal corresponding to a normal pattern to be displayed; (2) a plurality of series circuits connected in parallel with one another to said battery, each circuit having at least one light emitting diode which forms at least one part of said normal pattern and also having a driving means which controls illumination of the light emitting diode in response to the control signal from said first means; and
    (b) light emitting diode means connected in series between at least one of said light emitting diodes and said driving means for controlling the illumination of the light emitting diode provided in said circuit so as to assure that the output of said battery, when its terminal voltage is below a predetermined value, makes the pattern into a special symbol different from the normal pattern provided in accordance with the control signal.

3. An apparatus according to claim 2, wherein said diode means includes a semiconductor switching means having an output terminal connected to said diode means.

4. An apparatus according to claim 3, wherein said semiconductor switching means consists of a transistor.

5. An apparatus according to claim 4, wherein the transistor of said semiconductor switching means consists of an npn transistor.

6. An apparatus according to claim 2, wherein said plurality of circuits comprises seven said circuits.

7. An apparatus for checking the output voltage of a battery in a digital display device comprising:
    (a) register means for storing a control signal corresponding to a normal pattern to be displayed;
    (b) decoder means connected to said register means;
    (c) a plurality of series circuits connected in parallel with one another to the battery, each circuit having at least one light emitting diode which forms a part of said normal pattern and the light emitting diode of each circuit being controlled by a signal from said decoder means; and
    (d) diode means connected in series with at least one of said light emitting diodes for controlling the illumination of the light emitting diode provided in said circuit so as to assure that the output of the battery, when its terminal voltage is below a predetermined value, makes the pattern into a special symbol different from the normal pattern provided in accordance with the control signal.

* * * * *